(12) United States Patent
Takahashi

(10) Patent No.: US 11,664,764 B2
(45) Date of Patent: May 30, 2023

(54) OSCILLATOR AND COMMUNICATION METHOD

(71) Applicant: Seiko Epson Corporation, Tokyo (JP)

(72) Inventor: Tomoaki Takahashi, Minowa (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/678,087

(22) Filed: Feb. 23, 2022

(65) Prior Publication Data

US 2022/0271713 A1  Aug. 25, 2022

(30) Foreign Application Priority Data

Feb. 24, 2021  (JP) .............................. JP2021-027018

(51) Int. Cl.
*H03B 5/32* (2006.01)
*H03K 21/08* (2006.01)
*G11C 7/10* (2006.01)

(52) U.S. Cl.
CPC ............... *H03B 5/32* (2013.01); *H03K 21/08* (2013.01); *G11C 7/1078* (2013.01)

(58) Field of Classification Search
CPC ............ G11C 7/1078; H03B 5/30–368; H03K 21/08–14
USPC ................................................ 331/154, 158
See application file for complete search history.

(56) References Cited

U.S. PATENT DOCUMENTS

| | | | |
|---|---|---|---|
| 5,831,485 A * | 11/1998 | Nelson | H03L 1/02 331/158 |
| 7,541,878 B2 * | 6/2009 | Haiut | H03L 7/085 331/116 R |
| 7,800,457 B2 * | 9/2010 | Unkrich | H03L 7/099 331/158 |
| 2008/0180186 A1 * | 7/2008 | Higuchi | H03H 9/0542 331/158 |
| 2011/0050352 A1 * | 3/2011 | Kondo | G01N 29/036 331/46 |
| 2014/0298127 A1 | 10/2014 | Sato | |
| 2018/0076816 A1 * | 3/2018 | Matsuzaki | G01K 7/32 |
| 2018/0212593 A1 * | 7/2018 | Usuda | H03B 5/36 |
| 2020/0119722 A1 * | 4/2020 | Kamiyama | G06F 1/12 |

FOREIGN PATENT DOCUMENTS

JP  2014-190961 A  10/2014

* cited by examiner

*Primary Examiner* — Levi Gannon
(74) *Attorney, Agent, or Firm* — Harness, Dickey & Pierce, P.L.C.

(57) ABSTRACT

There is configured an oscillator including a resonator, and a circuit device, wherein the circuit device includes a first terminal, a storage circuit configured to store data corresponding to an external signal input from the first terminal, an oscillation circuit configured to generate an oscillation signal using the resonator, a counter circuit configured to count a period in which the external signal has a first polarity and a period in which the external signal has a second polarity using a clock signal generated based on the oscillation signal, and a processing circuit configured to write the data in the storage circuit based on a counting result of the counter circuit.

10 Claims, 5 Drawing Sheets

FIG. 3

| LEVEL OF EXTERNAL SIGNAL OS | COUNT NUMBER OF COUNTER CIRCUIT 52 | COUNTING RESULT | LEAST SIGNIFICANT BIT OF sftreg SIGNAL |
|---|---|---|---|
| High | 29 TO 33 | FIRST RANGE | 1 |
| | 58 TO 66 | SECOND RANGE | 11 |
| | 87 TO 99 | THIRD RANGE | 111 |
| | 116 TO 132 | FOURTH RANGE | 1111 |
| | 145 TO 165 | FIFTH RANGE | 11111 |
| | 174 TO 198 | SIXTH RANGE | 111111 |
| | 203 TO 231 | SEVENTH RANGE | 1111111 |
| | 232 TO 264 | EIGHTH RANGE | 11111111 |
| Low | 29 TO 33 | FIRST RANGE | 0 |
| | 58 TO 66 | SECOND RANGE | 00 |
| | 87 TO 99 | THIRD RANGE | 000 |
| | 116 TO 132 | FOURTH RANGE | 0000 |
| | 145 TO 165 | FIFTH RANGE | 00000 |
| | 174 TO 198 | SIXTH RANGE | 000000 |
| | 203 TO 231 | SEVENTH RANGE | 0000000 |
| | 232 TO 264 | EIGHTH RANGE | 00000000 |

FIG. 4

| | |
|---|---|
| SIXTH BIT | THIRD CLOCK AMPLITUDE [1] |
| FIFTH BIT | THIRD CLOCK AMPLITUDE [0] |
| FOURTH BIT | THIRD CLOCK ENABLE |
| THIRD BIT | SECOND CLOCK AMPLITUDE [1] |
| SECOND BIT | SECOND CLOCK AMPLITUDE [0] |
| LEAST SIGNIFICANT BIT | SECOND CLOCK ENABLE |

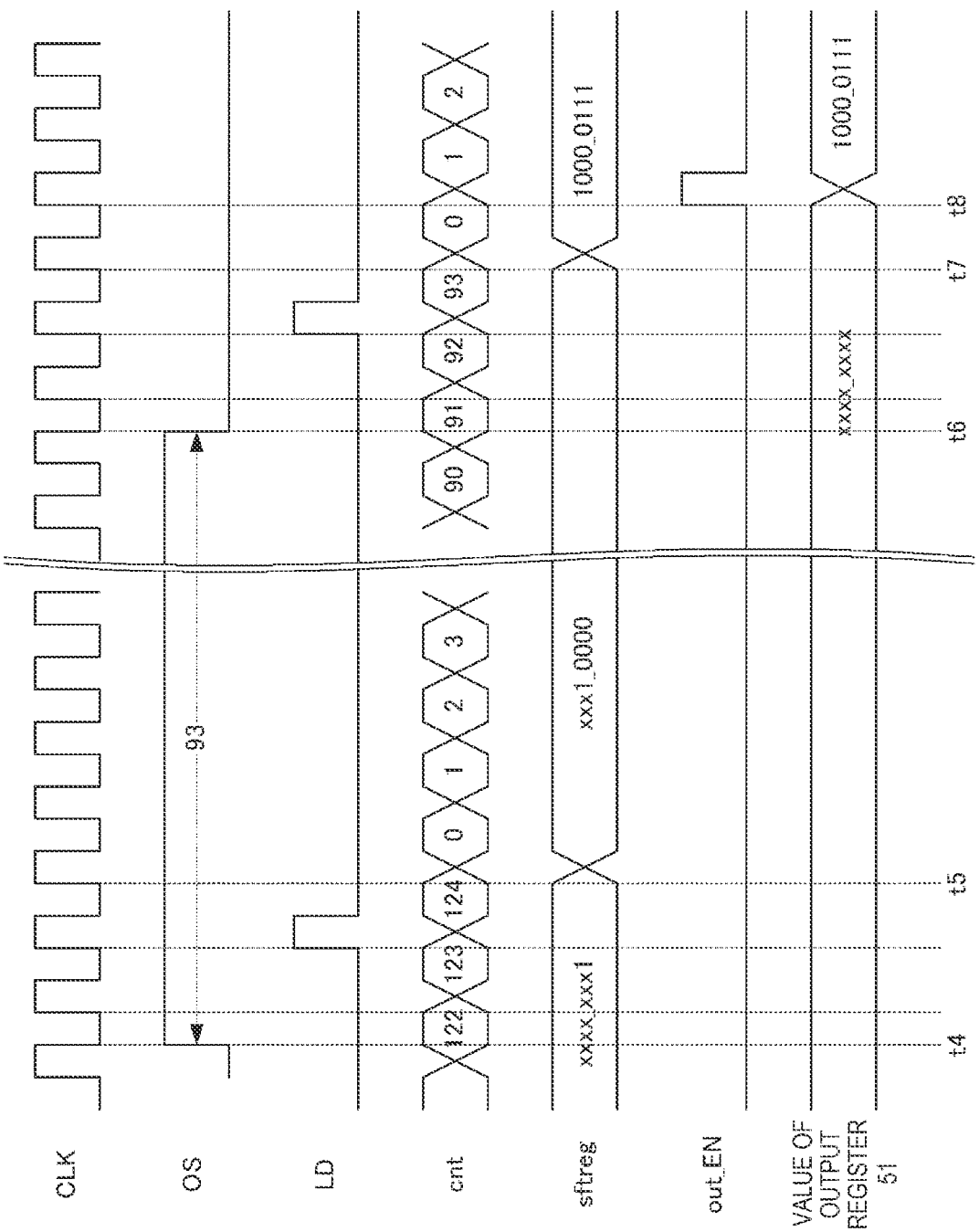

OSCILLATOR AND COMMUNICATION METHOD

The present application is based on, and claims priority from JP Application Serial Number 2021-027018, filed Feb. 24, 2021, the disclosure of which is hereby incorporated by reference herein in its entirety.

BACKGROUND

1. Technical Field

The present disclosure relates to an oscillator and a communication method.

2. Related Art

In the past, there has been known a technology which makes it possible to input a signal from the outside to an oscillator which generates an oscillation signal using a resonator. For example, in JP-A-2014-190961, there is disclosed an oscillator capable of executing single-wire serial communication.

In 1-WIRE (registered trademark) as the single-wire serial communication, "0" and "1" are discriminated by changing a width of a low pulse. Further, in general, when transmitting "1" in the binary system from a master, a short (e.g., 1 through 15 μs) low pulse is transmitted. When transmitting "0" in the binary system, a long (e.g., 60 μs) low pulse is transmitted. As described above, in the related-art single-wire serial communication, since it is necessary to discriminate the length of the low pulse, it is necessary to provide a significant difference in length between the low pulses corresponding respectively to "1" and "0" in order not to be affected by errors.

SUMMARY

In view of the problems described above, a circuit device according to the present disclosure includes a resonator, and a circuit device, wherein the circuit device includes a first terminal, a storage circuit configured to store data corresponding to an external signal input from the first terminal, an oscillation circuit configured to generate an oscillation signal using the resonator, a counter circuit configured to count a period in which the external signal has a first polarity and a period in which the external signal has a second polarity using a clock signal generated based on the oscillation signal, and a processing circuit configured to write the data in the storage circuit based on a counting result of the counter circuit.

Further, in view of the problems described above, a communication method according to the present disclosure is a communication method using an oscillator including a resonator and a circuit device, the method including the steps of inputting by an external device an external signal to a first terminal of the circuit device, generating by the oscillator a clock signal using the resonator, counting a period in which the external signal has a first polarity and a period in which the external signal has a second polarity using the clock signal, and writing data corresponding to the external signal in a storage circuit based on a result of the counting.

BRIEF DESCRIPTION OF THE DRAWINGS

FIG. 3 is a diagram showing an example of a relationship between a counting result and an sftreg signal.

FIG. 4 is a diagram showing a format of data corresponding to an external signal.

FIG. 6 is a timing chart of the single-wire serial communication mode.

DESCRIPTION OF EXEMPLARY EMBODIMENTS

Here, some embodiments of the present disclosure will be described in the following order.
(1) Configuration of Oscillator:
(2) Single-Wire Serial Communication Mode:
(2-1) Operational Example
(3) Other Embodiments:

(1) Configuration of Oscillator

Figure 1:
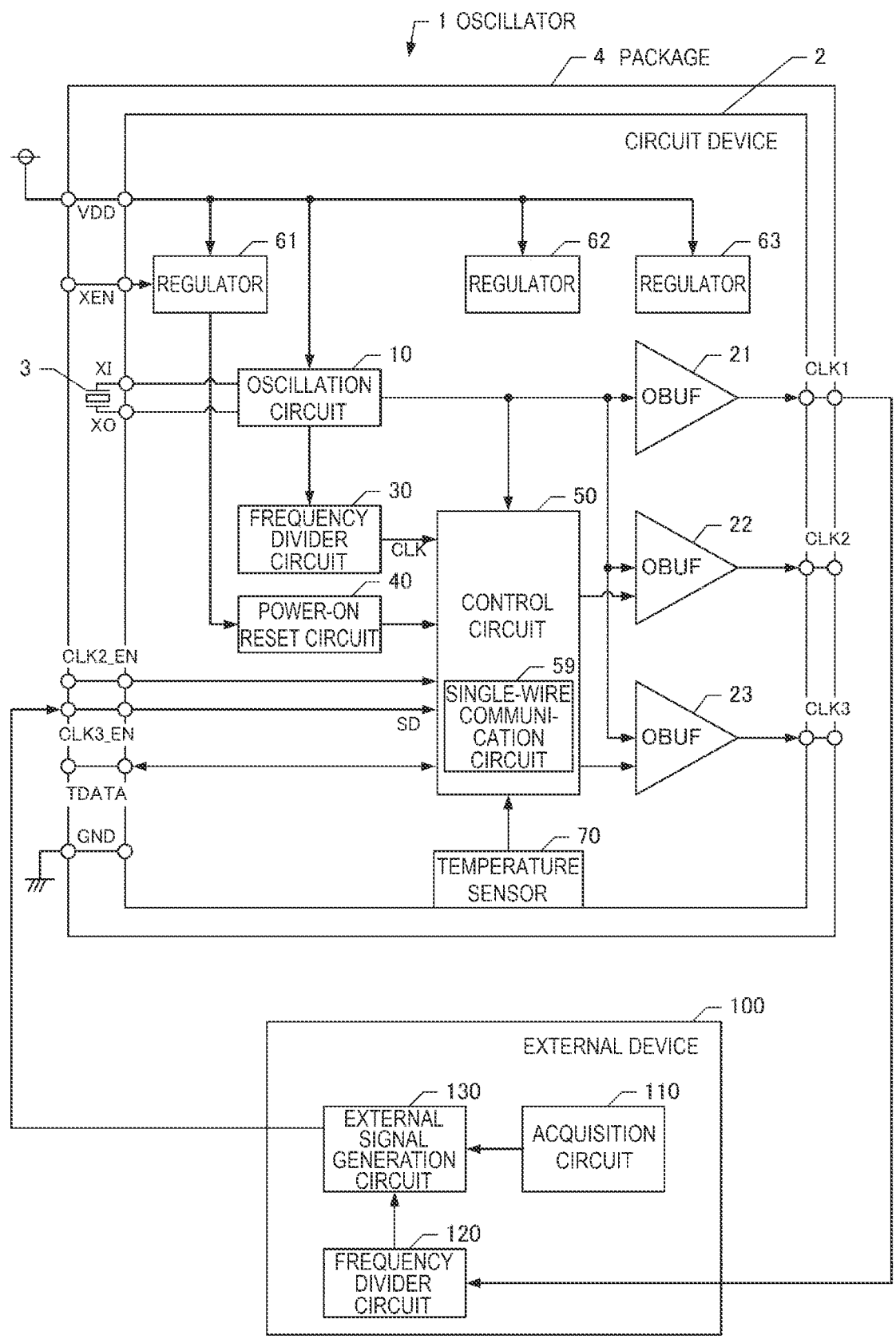
FIG. 1 is a configuration diagram of an oscillator according to an embodiment of the present disclosure.

FIG. 1 is a configuration diagram of an oscillator 1 according to an embodiment of the present disclosure. The oscillator 1 is provided with a container 4 for housing a circuit device 2 and a resonator 3. In the present embodiment, the resonator 3 is a quartz crystal resonator using quartz crystal as a substrate material, and there is used, for example, an AT-cut crystal resonator or an SC-cut crystal resonator. The resonator 3 can be an SAW (Surface Acoustic Wave) resonator or an MEMS (Micro Electro Mechanical Systems) resonator. Further, as the substrate material of the resonator 3, there can be used a piezoelectric single crystal of lithium tantalate, lithium niobate, or the like, a piezoelectric material such as piezoelectric ceramics including lead zirconate titanate, or a silicon semiconductor material besides the quartz crystal. As an excitation device of the resonator 3, there can be used a device using a piezoelectric effect, or electrostatic drive using a coulomb force.

The container 4 has a space inside, and is airtightly sealed so as to create a reduced pressure atmosphere such as a vacuum or an inert gas atmosphere with nitrogen, argon, helium, or the like inside. On an outer surface of the container 4, there are disposed external terminals. In FIG. 1, the external terminals are schematically shown with open circles overlapping a contour line of a rectangle representing the container 4. On an outer surface of the circuit device 2, there are disposed terminals for inputting or outputting a variety of signals. The terminals provided to the circuit device 2 are also shown schematically with open circles. Most of the external terminals provided to the container 4 are electrically coupled to the terminals provided to the circuit device 2, respectively. It should be noted that a terminal XI and a terminal XO as terminals to which the resonator 3 fixed inside the container 4 is to be coupled are coupled to the resonator 3, but are not coupled to the external terminals.

The circuit device 2 is provided with a high-potential power supply terminal VDD, a low-potential power supply terminal GND, a pull-down terminal XEN, two types of output enable terminals CLK2_EN, CLK3_EN for an oscillation signal, a temperature data outputting terminal TDATA, and three types of output terminals CLK1, CLK2, and CLK3 of the oscillation signal besides the terminals to which the resonator 3 is coupled. It should be noted that in the present embodiment, the output enable terminal CLK3_EN for the oscillation signal is coupled to the external terminal provided to the container 4. Here, the output enable terminal CLK3_EN for the oscillation signal is a first terminal, and the external terminal coupled to the output enable terminal CLK3_EN for the oscillation signal is a first external terminal. In other words, in the present embodiment, the output enable terminal CLK3_EN for the oscillation signal is also used as an input terminal of an external signal. It should be noted that since the output enable terminal CLK3_EN for the oscillation signal as the first terminal in the present embodiment is electrically coupled to the external terminal provided to the container 4, it is possible to easily supply the external signal to the terminal CLK3_EN provided to the circuit device 2 from the outside of the container 4.

The circuit device 2 can operate in a plurality of modes. Although the modes are not limited, in the present embodiment, the circuit device 2 has at least a normal mode for outputting the oscillation signal, a two-wire serial communication mode for performing two-wire serial communication, and a single-wire communication mode for performing single-wire serial communication. In the normal mode, the circuit device 2 can output the oscillation signal selected from three types of oscillation signals.

Specifically, when a signal instructing "enable" is input to none of the output enable terminals CLK2_EN, CLK3_EN for the oscillation signal, the circuit device 2 outputs a predetermined oscillation signal from the output terminal CLK1 of the oscillation signal. The oscillation signal output from the output terminal CLK1 is hereinafter called a first clock signal.

When the signal instructing "enable" is input to the output enable terminal CLK2_EN for the oscillation signal, the circuit device 2 outputs a predetermined oscillation signal from the output terminal CLK2 of the oscillation signal. The oscillation signal output from the output terminal CLK2 is hereinafter called a second clock signal.

When the signal instructing "enable" is input to the output enable terminal CLK3_EN for the oscillation signal, the circuit device 2 outputs a predetermined oscillation signal from the output terminal CLK3 of the oscillation signal. The oscillation signal output from the output terminal CLK3 is hereinafter called a third clock signal.

It is sufficient for the first clock signal, the second clock signal, and the third clock signal to be different in characteristics from each other, and in the present embodiment, at least one of a frequency, an amplitude, and a noise characteristic can be different therebetween. It should be noted that the frequency and the amplitude can be adjusted by changing a circuit configuration or a capacity of a buffer circuit described later, and the noise characteristic can be adjusted by a layout and so on of the buffer circuit. It should be noted that the layout means whether to be laid out near to, for example, a large ground pad.

The purpose of each of the terminals described above in the circuit device 2 is a purpose in the normal mode. In another mode, the purposes of at least some of the terminals are changed to different purposes. The two-wire serial communication mode can be realized by communication compliant to a variety of types of standards, but in the present embodiment, the I²C standard is adopted. Further, in the two-wire serial communication mode, the output enable terminal CLK2_EN for the oscillation signal turns to an input terminal of a serial clock signal SCL. The output enable terminal CLK3_EN for the oscillation signal turns to an input terminal of a serial data SDA. It should be noted that in the two-wire serial communication mode according to the present embodiment, by inputting a signal to the circuit device 2 from the outside of the circuit device 2 using the serial communication, it is possible to perform writing to a register provided to a control circuit 50 and so on. As a result, it is possible to perform a variety of types of setup using the serial communication.

In the present embodiment, in the single-wire serial communication mode, the output enable terminal CLK3_EN for the oscillation signal turns to an input terminal for inputting a serial signal. It should be noted that in the single-wire serial communication mode according to the present embodiment, by inputting a signal to the circuit device 2 from the outside of the circuit device 2 using the serial communication, it is possible to perform writing to the register provided to the control circuit 50 and so on. As a result, it is possible to perform a variety of types of setup. It should be noted that the circuit device 2 in the present embodiment is capable of outputting the first clock signal from the output terminal CLK1 even in the single-wire serial communication mode.

In the present embodiment, the circuit device 2 includes an oscillation circuit 10, buffer circuits 21 through 23, a frequency divider circuit 30, a power-on reset circuit 40, the control circuit 50, regulators 61 through 63, and a temperature sensor 70. It should be noted that the circuit device 2 according to the present embodiment can be provided with a configuration obtained by eliminating or modifying some of these constituents, or adding other constituents. In the present embodiment, the circuit device 2 is a semiconductor integrated circuit (IC) formed as a single chip.

The regulators 61 through 63 each convert a power supply voltage coupled to the high-potential power supply terminal VDD into a predetermined voltage, and then supply the predetermined voltage to circuits in the circuit device 2. The voltage values are not limited, and when, for example, the power supply voltage coupled to the high-potential power supply terminal VDD is 1.5 V, the regulators 61 through 63 convert the power supply voltage into voltages such as 1.2 V or 1.0 V. In the present embodiment, an output voltage of the regulator 61 is 1.2 V, and is supplied to, for example, the control circuit 50. Output voltages of the regulators 62, 63 are 1.0 V, and are supplied to, for example, the buffer circuits 21 through 23.

The oscillation circuit 10 is a circuit for generating the oscillation signal using the resonator 3. In the present embodiment, the oscillation circuit 10 amplifies an output signal of the resonator 3, then feeds back the result to the resonator 3, and then outputs the oscillation signal based on the oscillation of the resonator 3. A variety of methods can be adopted as an oscillation method of the oscillation circuit 10. For example, the oscillation circuit constituted by the resonator 3 and the oscillation circuit 10 can be a variety of types of oscillation circuit such as a Pierce oscillation circuit, an inverter-type oscillation circuit, a Colpitts oscillation circuit, or a Hartley oscillation circuit.

The buffer circuits 21 through 23 are each a circuit for buffering and then outputting the oscillation signal output by the oscillation circuit 10. The buffer circuits 21 through 23 output the signals thus buffered to the output terminals CLK1, CLK2, and CLK3 of the oscillation signals, respectively. In other words, the first clock signal, the second clock signal, and the third clock signal are output from the output terminals CLK1, CLK2, and CLK3, respectively. Since the output terminals are electrically coupled to the external terminals of the oscillator 1, these oscillation signals are output to the outside from the oscillator 1.

In the present embodiment, the oscillation signal output from the oscillation circuit 10 has a frequency of 76.8 MHz. The buffer circuit 21 is a circuit which adjusts the frequency of the oscillation signal to half to output the oscillation signal having a frequency of 38.4 MHz and a predetermined amplitude. The buffer circuit 22 is a circuit which outputs the oscillation signal having an amplitude set by the user without changing the frequency of the oscillation signal output from the oscillation circuit 10. The buffer circuit 23 is a circuit which outputs the oscillation signal having an amplitude set by the user without changing the frequency of the oscillation signal output from the oscillation circuit 10. It should be noted that the buffer circuits 22, 23 are different in noise level.

Such buffer circuits 21 through 23 as described above can be realized by a variety of known circuits. For example, the adjustment of the frequency can be realized by, for example, a variety of types of frequency divider circuits. A circuit for performing the adjustment of the amplitude can be realized by a variety of known circuits for performing, for example, a gain adjustment.

The frequency divider circuit 30 divides the oscillation signal output by the oscillation circuit 10 with a predetermined frequency division ratio to generate a clock signal. In the present embodiment, the oscillation signal output by the oscillation circuit 10 has the frequency of 76.8 MHz, and is divided in frequency so that the frequency is reduced to $\frac{1}{16}$. Therefore, in the present embodiment, the clock signal has a frequency of 4.8 MHz. The clock signal thus obtained is hereinafter called a clock signal CLK. It should be noted that the frequency of the clock signal CLK is illustrative only, and other frequencies can be adopted. Further, in the frequency divider circuit 30, it is possible to vary the frequency of the clock signal CLK to be output in accordance with a designation of the frequency division ratio.

The power-on reset circuit 40 is a circuit for outputting a signal representing the fact that the voltage output from the regulator 61 has been stabilized. For example, an output signal of the power-on reset circuit 40 is unstable immediately after powering on the circuit device 2, and then, turns to a signal at a low level, and when the output voltage of the regulator 61 is stabilized, the power-on reset circuit 40 outputs a signal at a high level. In the present embodiment, the signal output from the power-on reset circuit 40 is input to the control circuit 50. The output of the power-on reset circuit 40 can be used for a variety of purposes. For example, it is possible to adopt a configuration in which when the output voltage of the regulator 61 is stabilized, the register provided to the control circuit 50 is reset based on the signal output from the power-on reset circuit 40.

The temperature sensor 70 is a circuit for outputting a signal corresponding to the ambient temperature of the temperature sensor 70, and can be formed of a variety of known circuits. It is possible to adopt, for example, a circuit for outputting a signal of a voltage corresponding to the temperature using a variety of diodes. It is obvious that the signal corresponding to the temperature can be a current, or it is possible to adopt a configuration in which the temperature can be detected using both of the voltage and the current. The signal corresponding to the temperature output by the temperature sensor 70 is supplied to the control circuit 50.

The control circuit 50 is a circuit which performs processing based on the variety of signals input thereto, and then outputs a signal corresponding to the processing result. It is sufficient for the control circuit 50 to be able to execute a variety of types of processing. For example, it is possible for the control circuit 50 to adopt a configuration in which predetermined arithmetic processing is performed based on the output signal of the temperature sensor 70 to output a digital value representing the temperature from the temperature data outputting terminal TDATA. The control circuit 50 is configured to be able to execute a variety of types of processing besides the output processing of the digital value representing the temperature. For example, it is possible for the control circuit 50 to execute reception of a mode change instruction and arithmetic processing corresponding to an input signal in the mode having been changed.

(2) Single-Wire Serial Communication Mode

As described above, the circuit device 2 can operate in the modes other than the normal mode, and in the present embodiment, the control circuit 50 operates in the normal mode when predetermined time (e.g., 0.8 ms) elapses after the power supply.

In contrast, in the normal mode, when a predetermined signal is input to the output enable terminals CLK2_EN, CLK3_EN for the oscillation signal, the control circuit 50 makes the transition to the two-wire serial communication mode. In other words, when a predetermined signal is input to the output enable terminals CLK2_EN, CLK3_EN for the oscillation signal, a value of a shift register provided to the control circuit 50 is rewritten. Further, when the value of the shift register is a specific value, the control circuit 50 operates in the two-wire serial communication mode.

Further, in the two-wire serial communication mode, by inputting serial clock SCL and the serial data SDA respectively to the output enable terminals CLK2_EN, CLK3_EN for the oscillation signal, it is possible to rewrite the value of the shift register provided to the control circuit 50. Further, when the value of the shift register is a specific value, the control circuit 50 operates in the single-wire serial communication mode. The control circuit 50 is provided with a single-wire communication circuit 59 for performing signal processing in the single-wire serial communication mode. When operating in the single-wire serial communication mode, the control circuit 50 electrically couples the single-wire communication circuit 59 and the terminal CLK3_EN to each other to establish a state in which the signal processing by the single-wire communication circuit 59 is performed.

Further, in the single-wire serial communication mode, by inputting a pulse having a width corresponding to the digital value to the output enable terminal CLK3_EN for the oscillation signal, it is possible to rewrite the value of the shift register provided to the control circuit 50. Then, the oscillation signal to be output is selected in accordance with the value of the shift register.

As described above, the control circuit 50 can operate in a variety of modes. Further, when the mode differs between the variety of modes, the functions of the terminals (CLK2_EN, CLK3_EN, and TDATA) electrically coupled to the control circuit 50 change. Such a change in function is realized by adopting a configuration in which a circuit electrically coupled inside the control circuit 50 is switched in accordance with the mode.

Figure 2:
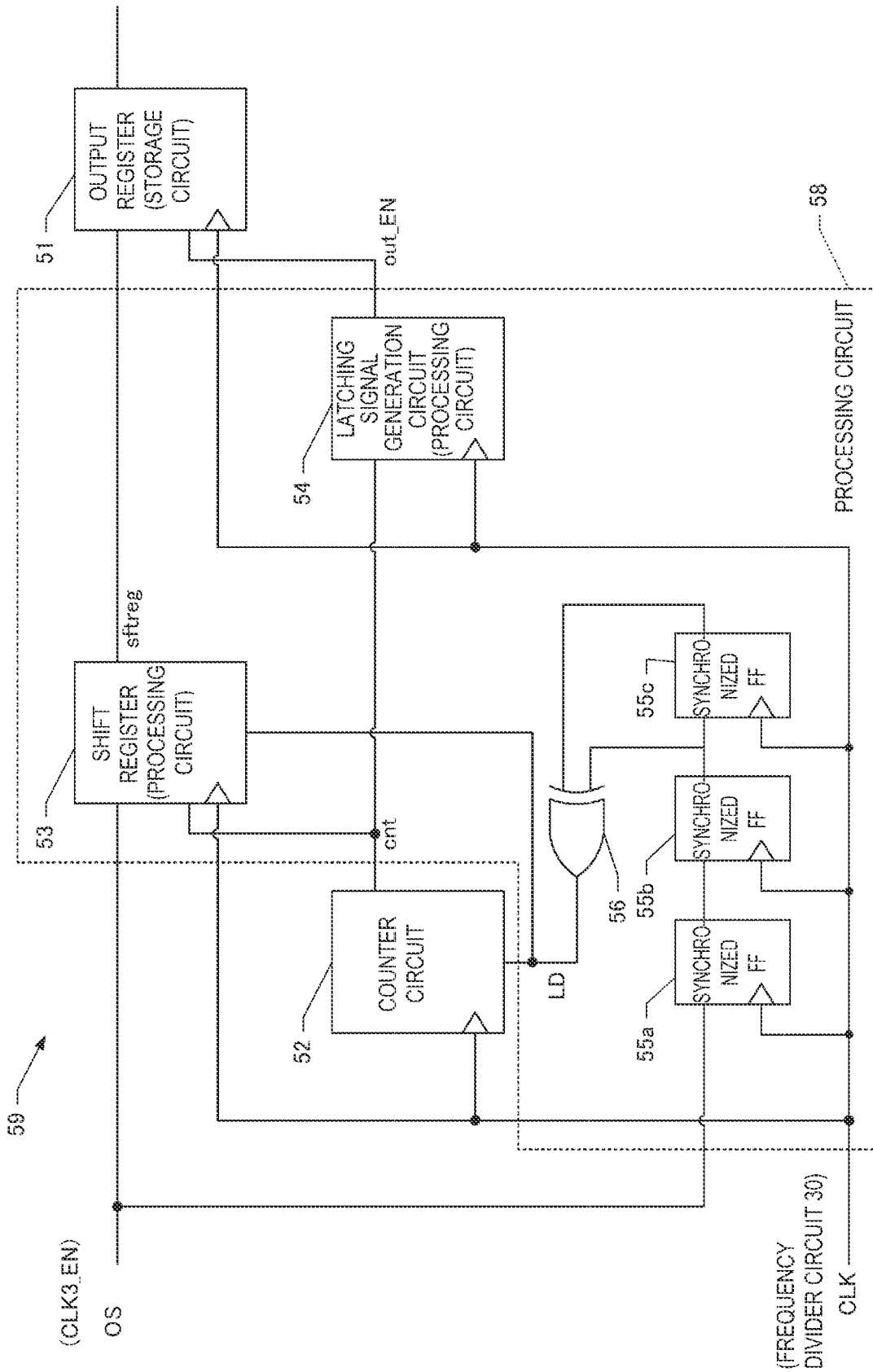
FIG. 2 is a diagram showing a counter circuit, a processing circuit, and a storage circuit.

FIG. 2 is a block diagram showing the signal-wire communication circuit 59. The single-wire communication circuit 59 includes an output register 51, a counter circuit 52, and a processing circuit 58. The processing circuit 58 includes a shift register circuit 53, a latching signal generation circuit 54, synchronized flip-flops 55a through 55c, and an EXCLUSIVE-OR circuit 56.

The output register 51 is a circuit for storing data corresponding to an external signal OS input from the terminal CLK3_EN. The counter circuit 52 is a circuit which counts a period in which the external signal OS is at a high level and a period in which the external signal OS is at a low level using the clock signal CLK output from the frequency divider circuit 30. The shift register circuit 53 and the latching signal generation circuit 54 are circuits which write a bit value corresponding to the external signal OS into the output resistor 51 based on the counting result of the counter circuit 52.

Therefore, in the present embodiment, the output register 51 is a storage circuit, and the terminal CLK3_EN is the first terminal. Further, the clock signal CLK output from the frequency divider circuit 30 is the clock signal generated based on the oscillation signal of the resonator 3. Further, in the present embodiment, the high level of the external signal OS is a first polarity, and the low level thereof is a second polarity.

The frequency divider circuit 30 is electrically coupled to clock terminals of the synchronized flip-flops 55a through 55c, and the clock signal CLK output from the frequency divider circuit 30 is input to the clock terminals as clock signals. Further, the synchronized flip-flops 55a through 55c are cascaded. In other words, the terminal CLK3_EN is electrically coupled to an input terminal of the synchronized flip-flop 55a, and thus, the external signal OS becomes an input signal. An output of the synchronized flip-flop 55a is input to the synchronized flip-flop 55b, and an output of the synchronized flip-flop 55b is input to the synchronized flip-flop 55c. The output of each of the synchronized flip-flops 55b, 55c is input to the EXCLUSIVE-OR circuit 56.

Due to the configuration described above, the synchronized flip-flops 55a through 55c function as a shift register for transmitting the level of the external signal OS to the flip-flop in the posterior stage in the order of the synchronized flip-flops 55a, 55b, and 55c in sync with the clock signal CLK. Therefore, when the state in which the level of the external signal OS is constant continues for four or more clock pulses of the clock signal CLK, all of the levels of the output of the synchronized flip-flops 55a through 55c become the same as each other. In contrast, in a period after the level of the external signal OS changes until the clock pulse of the clock signal CLK is input three times, there can be created the state in which the synchronized flip-flops 55a through 55c are different in output from each other.

Then, when the clock pulse of the clock signal CLK is input twice after the level of the external signal OS changes, the synchronized flip-flops 55b and 55c become different in level of the output from each other. Since the output of the synchronized flip-flop 55b and the output of the synchronized flip-flop 55c are input to the same EXCLUSIVE-OR circuit 56, when the synchronized flip-flops 55b, 55c are different in level of the output, the EXCLUSIVE-OR circuit 56 outputs the high level. In contrast, in the other state, namely when the output levels of the synthesized flip-flops 55b, 55c are the same, the EXCLUSIVE-OR circuit 56 outputs the low level. Therefore, the synthesized flip-flops 55a through 55c and the EXCLUSIVE-OR circuit 56 constitute a circuit for outputting a pulse (a pulse generated at a timing delayed as much as several clock pulses) in sync with a change in level of the external signal OS. In the present embodiment, that pulse is called a polarity reversion detection signal LD. It should be noted that in the present embodiment, the synthesized flip-flops 55a through 55c are totally three flip-flop circuits, but the number is not limited providing the number is no smaller than two.

The counter circuit 52 is a circuit to which the clock signal CLK and the polarity reversion detection signal LD are input, and which outputs a count signal cnt representing a counting result of the clock pulses of the clock signal CLK. Such a circuit can be configured with, for example, a known shift register. In the present embodiment, the counter circuit 52 outputs the count signal cnt in 8 bits in parallel, but in FIG. 2, the output signal lines are represented by a single line.

Specifically, the counter circuit 52 starts the count of the clock pulses of the clock signal CLK taking the input of the polarity reversion detection signal LD as a trigger. Then, the counter circuit 52 changes the value of the least significant bit every time the clock pulse of the clock signal CLK is input, and sequentially changes a value of a higher bit in accordance with a predetermined change in a value of a lower bit. As a result, the counter circuit 52 counts the number of times of the input of the clock pulse of the clock signal CLK within a range of 0 through 255, and then outputs the result in parallel as the count signal cnt. For example, when the clock pulse of the clock signal CLK is counted twice, the count signal cnt becomes 00000010, and when the clock pulse of the clock signal CLK is counted 15 times, the count signal cnt becomes 00001111.

The counter circuit 52 starts the count of the clock pulses of the clock signal CLK taking the input of the polarity reversion detection signal LD as a trigger, when the polarity reversion detection signal LD is input before the number of the clock pulses reaches 255, the counter circuit 52 restarts the count. In other words, since the external signal OS is a signal which repeats a change between the high level and the low level, the counter circuit 52 starts the count every time the level of the external signal OS changes. As a result, the counter circuit 52 sequentially repeats the processing of outputting the counting result representing the period in which the external signal OS is at the high level as the count signal cnt, and then outputting the counting result representing a period in which the external signal OS is at the low level as the count signal cnt.

The shift register circuit 53 is a circuit to which the clock signal CLK, the external signal OS, and the count signal cnt output by the counter circuit 52 are input, and which outputs a parallel signal in which the same value continues as much as the number of bits corresponding to the value represented by the count signal cnt. In other words, the shift register circuit 53 outputs the parallel signal in which the bit value having the same level as the level of the external signal OS continues as much as the number of digits corresponding to the magnitude of the count value represented by the count signal cnt. Here, the output is called an sftreg signal.

FIG. 3 is a diagram showing an example of a relationship between the counting result and the sftreg signal. When the counting result in the period in which the external signal OS is at the high level is in the m-th range, the shift register circuit 53 outputs the parallel signal in which m bits in a row from the least significant bit toward the most significant bit are at the high level. In contrast, when the counting result in the period in which the external signal OS is at the low level is in the n-th range, the shift register circuit 53 outputs the parallel signal in which n bits in a row from the least significant bit toward the most significant bit are at the low level. It should be noted that it is assumed in the present embodiment that the m-th range and the n-th range are the same range, but it is possible for the m-th range and the n-th range to be different from each other.

Here, the m-th range is defined by a lower limit threshold value and the upper limit threshold value for determining the number of digits of the bits which changes in accordance with the counting result. Specifically, in the present embodiment, when defining k as a unit count number as a natural number, and Δk as a unit tolerance number as a natural number, the m-th range is a range in which the counting result takes a value from m×(k−Δk) to m×(k+Δk). The unit count number k is a natural number, and it is sufficient for Δk to be a natural number smaller than k. In the present embodiment, k is 31, and Δk is 2. Therefore, the first range is 31±2, and the second range is 62±4. It should be noted that the unit tolerance number is a numerical value for defining a range in which a shift of the count number from k is allowed, and can take a variety of values.

In the present embodiment, when the counting result in the period in which the external signal OS is at the high level or the low level is in the m-th range, the shift register circuit 53 outputs the parallel signal in which m bits in a row from the least significant bit toward the most significant bit are at the high level or the low level. Therefore, for example, when the count result in the period in which the external signal OS is at the high level is 31, the count result is in the first range, and therefore, the shift register circuit 53 outputs the sftreg signal with the least significant bit set to 1. Subsequently, when the period in which the external signal OS is at the high level continues, and the count result becomes 62, the count result is in the second range, and therefore, the shift register circuit 53 outputs the sftreg signal with the low 2 bits set to 1.

When the count result in the period in which the external signal OS is at the low level is 31, the count result is in the first range, and therefore, the shift register circuit 53 outputs the sftreg signal with the least significant bit set to 0. Subsequently, when the period in which the external signal OS is at the low level continues, and the count result becomes 62, the count result is in the second range, and therefore, the shift register circuit 53 outputs the sftreg signal with the low 2 bits set to 0.

Such a shift register circuit 53 as described above can be realized by known circuits such as flip-flop circuits for outputting values of the respective bits, and selector circuits for controlling signals to be input to the respective flip-flop circuits. In other words, the eight flip-flop circuits are cascaded via the selector circuits. Here, the output of the first flip-flop circuit has the value of the least significant bit, and the outputs of the first through eighth flip-flop circuits thus cascaded are set in parallel as the sftreg signal.

To an input terminal of the first flip-flop circuit for outputting the value of the least significant bit of the sftreg signal, there is input the external signal OS via the selector circuit. When the value of the count signal cnt is in the first range, the selector circuit inputs the external signal OS to the flip-flop circuit. Therefore, the output of the first flip-flop circuit becomes the same in level as the external signal OS.

Further, to the input terminal of the L-th flip-flop circuit for outputting the value of the L-th bit of the sftreg signal, there is input the output of the (L−1)-th flip-flop circuit via the selector circuit (L is a natural number in a range of 2 through 8). In this configuration, the selector circuit corresponding to the L-th flip-flop circuit inputs the output of the (L−1)-th flip-flop circuit to the L-th flip-flop circuit when the value of the count signal cnt is in the L-th range. Therefore, when the period in which the level of the external signal OS is constant reaches the L-th range of the count number of the clock signal, the output of the L-th flip-flop circuit becomes the same in level as the output of the (L−1)-th flip-flop circuit.

As described above, in the shift register circuit 53, the number of the bits in which the level of the external signal OS is shifted in the flip-flop circuits is determined in accordance with the counting result of the count signal cnt, and the result thus shifted is output as the sftreg signal. As a result, the parallel signal in which the bit value having the same level as the level of the external signal OS continues as much as the number of digits corresponding to the magnitude of the count value represented by the count signal cnt is output. It should be noted that although the trigger for outputting the sftreg signal from the flip-flop circuits can be generated at a variety of timings, in the present embodiment, there is adopted the configuration in which the sftreg signal is output from the flip-flop circuits in sync with the timing at which the polarity reversion detection signal LD becomes at the high level.

The latching signal generation circuit 54 is a circuit for controlling whether to write the sftreg signal output from the shift register circuit 53 into the output register 51. In the single-wire serial communication mode related to the present embodiment, the protocol is stipulated so that the external signal OS is input to the control circuit 50 in terms of information as much as 8 bits. Therefore, the latching signal generation circuit 54 outputs an output enable signal for storing the sftreg signal to the output register 51 when the clock pulses of the clock signal CLK as much as 8 bits are counted. In the present embodiment, the output enable signal is denoted by out_EN.

Such a latching signal generation circuit 54 can be realized by known circuits such as flip-flop circuits as much as 8 bits for setting the bits corresponding to the counting result of the clock pulses of the clock signal CLK to the high level, selector circuits for controlling signals to be input to the respective flip-flop circuits, an AND gate, and so on.

In other words, the selector circuits are coupled to respective input terminals of the eight flip-flop circuits. Respective outputs of the eight flip-flop circuits are input to the AND gate. An input signal to the selector circuit is a signal fixed to the high level or the low level. In the selector circuits, the input signal at the low level is selected, and is then output in an initial state. In contrast, the selector circuit which corresponds to the flip-flop circuit for outputting the value of the L-th bit selects a signal at the high level when the value of the count signal cnt is in the L-th range (L is a natural number in a range of 1 through 8). Further, the selector circuits are set to the initial state when the polarity reversion detection signal LD becomes at the high level, and then, after selecting the output signal, the selector circuits do not restore to the initial state until the clock pulses of the clock signal CLK as much as 8 bits are subsequently counted.

Therefore, when the value of the count signal cnt is in the first range, the signal at the high level is input to the flip-flop circuit for outputting the value of the first bit (the least significant bit). Similarly, when the value of the count signal cnt is in the L-th range, the signal at the high level is input to the flip-flop circuit for outputting the value of the L-th bit. Therefore, when the clock pulse of the clock signal CLK is input to the flip-flop circuit after the value of the count signal cnt becomes in the eighth range, there is created the state in which the parallel signal in which all of the 8 bits are set to the high level is output.

Since the outputs of the flip-flop circuits are input to the AND gate, the signal at the high level is output from the AND gate only when all of the 8 bits as the output of the flip-flop circuits are set to the high level. Therefore, when the clock pulses of the clock signal CLK as much as 8 bits are counted, the latching signal generation circuit 54 outputs the out_EN signal to the output register 51.

The output register 51 is a storage circuit for storing the sftreg signal. In other words, the output register 51 is provided with a plurality of flip-flop circuits which stores the respective bit values of the sftreg signal taking the out_EN signal as a trigger. Since the out_EN signal is output in sync with the timing at which the clock pulses of the clock signal CLK as much as 8 bits are counted, the output register 51 holds the bit values of the sftreg signal with the respective flip-flop circuits in sync with the timing at which the clock pulses of the clock signal CLK as much as 8 bits are counted.

It should be noted that in the present embodiment, since there is adopted the configuration in which the count value as much as 8 bits can be obtained by the counter circuit 52, the bit number available as the sftreg signal output from the shift register circuit 53 is a maximum of 8 bits. However, an amount of information of the data which is recorded on the output register 51 and is referred to can be smaller than 8 bits. In this case, in the output register 51, the number of the flip-flop circuits for storing the value of the sftreg signal can be smaller than 8.

An example in which the low 6 bits in the sftreg signal are used will hereinafter be described. When a value is stored in the flip-flop circuits of the output register 51, the control circuit 50 performs an operation corresponding to the values of the bits. In the present embodiment, the control circuit 50 decides the availability of the outputs of the buffer circuits 22, 23 in accordance with the values of the bits to adjust the capacities of the buffer circuits 22, 23.

FIG. 4 shows roles of the values of the bits in the present embodiment, wherein the role of the least significant bit is described in the lowermost row, and the roles described in the higher rows are the roles of the higher bits. Specifically, the least significant bit is a bit for designating whether to output the second clock signal. When the least significant bit is 1, the control circuit 50 makes the buffer circuit 22 output the second clock signal. When the least significant bit is 0, the control circuit 50 does not make the buffer circuit 22 output the second clock signal. The second and third bits are bits for designating the amplitude of the second clock signal. The control circuit 50 changes the amplitude of the second clock signal at four levels in accordance with the value of 2 bits represented by the second and third bits.

The fourth bit is a bit for designating whether to output the third clock signal. When the fourth bit is 1, the control circuit 50 makes the buffer circuit 22 output the third clock signal. When the fourth bit is 0, the control circuit 50 does not make the buffer circuit 22 output the third clock signal. The fifth and sixth bits are bits for designating the amplitude of the third clock signal. The control circuit 50 changes the amplitude of the third clock signal at four levels in accordance with the value of 2 bits represented by the fifth and sixth bits.

Due to the configuration described hereinabove, it is possible for the oscillator 1 according to the present embodiment to receive the data for adjusting the capacities of the buffer circuits 22, 23 in the single-wire serial communication mode to adjust the capacities of the buffer circuits 22, 23. According to the oscillator 1 related to the present embodiment, by identifying the period in which the external signal OS is at the high level and the period in which the external signal OS is at the low level with the count number of the clock signal CLK, it is possible to identify the data represented by the external signal OS. Therefore, in the present embodiment, there is no need to provide a significant difference in pulse length to the external signal OS in order to discriminate the values 0 and 1 of the data represented by the external signal OS from each other. Therefore, it does not take an excessively long period of time to perform the input of either one of 0 and 1 of the data represented by the external signal OS compared to the other thereof, and it is possible to efficiently input serial data. Further, it is possible to discriminate 0 and 1 of the data represented by the external signal OS from each other with the level of the external signal OS. Therefore, it is possible to clearly discriminate 0 and 1 of the data without providing a significant difference in pulse length.

Further, in the present embodiment, when the counting result in the period in which the polarity is constant is the predetermined m-th range, the value is written to the output register 51 in the m bits in a row. Therefore, by adjusting the size of the m-th range, it is possible to adjust the responsiveness to the noise and the requirement to the accuracy of the external signal. Specifically, when the m-th range narrows, the range of the count number for changing the data is reduced, and therefore, it becomes difficult to be affected by the noise. It should be noted that when the m-th range narrows, it is necessary to more accurately control the period in which the polarity of the external signal is constant.

Therefore, it is possible to adjust the responsiveness to the noise and the requirement to the accuracy of the external signal using the size of the m-th range. It should be noted that the advantage described above can similarly be obtained even when the m-th range for counting the period in which the polarity is the first polarity and the n-th range for counting the period in which the polarity is the second polarity are different from each other.

Further, in the present embodiment, the m-th range (or the n-th range) is the range in which the counting result takes a value in a range of $m \times (k-\Delta k)$ through $m \times (k+\Delta k)$. There, the larger the value of m (or n) is, the broader the m-th range becomes. The larger the count value becomes, the higher the possibility that the count value is affected by the noise becomes. However, by adopting a configuration in which the larger the value of m is, the broader the m-th range becomes, it is possible to suppress a degree of increase in influence of the noise due to an increase in the count value.

(2-1) Operational Example

As described hereinabove, in the single-wire serial communication mode according to the present embodiment, the bit value is expressed by the level of the external signal OS and the period in which the external signal OS is at a constant level. Further, in the present embodiment, the external signal OS is a signal input from the terminal CLK3_EN. Therefore, it is necessary for the user who inputs the external signal OS in the single-wire serial communication mode to input the pulse signal to the terminal CLK3_EN from the external device located outside the oscillator 1.

It is sufficient for the external device to be able to input the pulse signal to the terminal CLK3_EN so that the voltage level changes in a predetermined range. In FIG. 1, there is illustrated an external device 100 for inputting the pulse signal to the terminal CLK3_EN. The external device 100 related to the present example is provided with an acquisition circuit 110, a frequency divider circuit 120, and an external signal generation circuit 130. The acquisition circuit 110 is a circuit for receiving the input of the 8-bit data by the user. The acquisition circuit 110 receives the input by the user with an input interface not shown to identify data to be stored in the output register 51.

The frequency divider circuit 120 is coupled to the output terminal CLK1, and divides the frequency of the first clock signal as the oscillation signal output by the buffer circuit 21. In the present embodiment, the frequency divider circuit 120 is substantially the same circuit as the frequency divider circuit 30, and converts the first clock signal with the frequency of 76.8 MHz into a clock signal with a frequency of 4.8 MHz as a signal the same in frequency as the frequency divider circuit 30.

The external signal generation circuit 130 is a circuit for generating the external signal OS corresponding to the data input by the user based on the clock signal with the frequency of 4.8 MHz output by the frequency divider circuit 120. In other words, the acquisition circuit 110 outputs the signal representing the data input by the user to the external signal generation circuit 130. The signal which has the levels corresponding to the bit values of the data as much as 8 bits input by the user, and in which the levels corresponding to the bit values continue for (bit digit number)×(unit count number k) is output by the external signal generation circuit 130 as the external signal OS.

For example, there is assumed a case where the data input by the user is 11110000. In this case, the signal in which the high level corresponding to the bit value 1 continues for the same period as the (4 digits)×(k times) clock pulses of the clock signal CLK, and the low level corresponding to the bit value 0 continues for the same period as the (4 digits)×(k times) clock pulses of the clock signal CLK is output by the external signal generation circuit 130 as the external signal OS. It should be noted that the external device 100 corresponds to, for example, a processor when the oscillator 1 is installed in an electronic apparatus such as a smart phone.

According to the configuration described hereinabove, it is possible for the user to perform the single-wire serial communication to adjust the capacities of the buffer circuits 22, 23 only by instructing the data to the acquisition circuit 110. Further, according to the configuration shown in FIG. 1, in the external signal OS, it is possible to adjust the period in which the polarity is constant in the external signal OS based on the oscillation signal of the resonator 3 and the oscillation circuit 10 as the same signal source as that of the frequency divider circuit 30. Therefore, when counting the period in which the polarity of the external signal OS is constant using the clock signal CLK output by the frequency divider circuit 30, it is possible to accurately measure the period.

Figure 5:
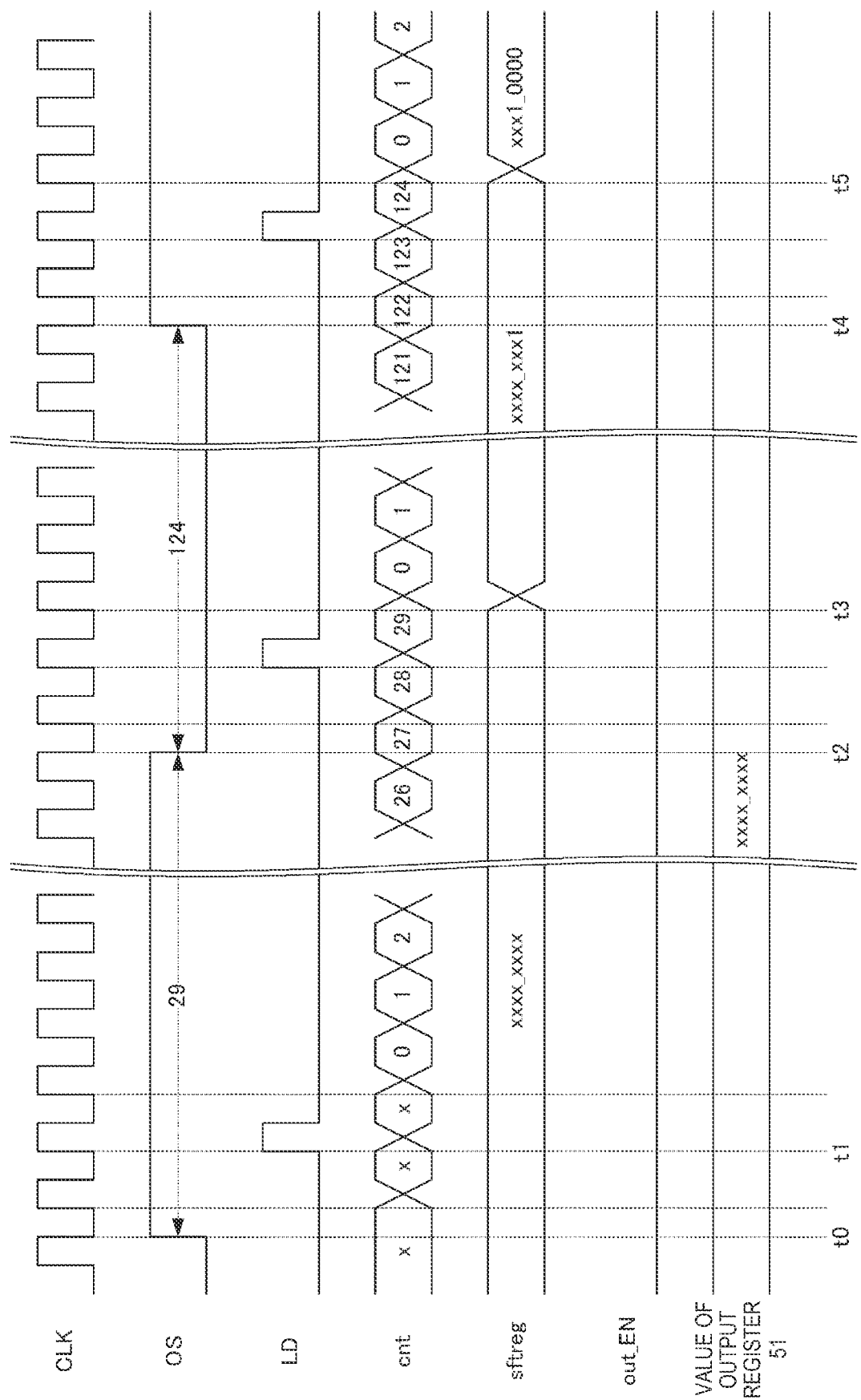
FIG. 5 is a timing chart of a single-wire serial communication mode.

FIG. 5 and FIG. 6 are timing charts showing an example of the count signal cnt and the sftreg signal obtained in accordance with the external signal OS in the single-wire serial communication mode. In these diagrams, "x" represents that the value of the signal is indefinite. In FIG. 5 and FIG. 6, it is assumed that the input of the external signal OS is started at the time point t0, FIG. 6 is a timing chart subsequent to the timing chart shown in FIG. 5 in chronological order, and the last part of FIG. 5 and the first part of FIG. 6 overlap each other in chronological order.

When the polarity of the external signal OS changes from the low level to the high level at the time point t0, the polarity reversion detection signal LD is output from the EXCLUSIVE-OR circuit 56 at the time point t1 after the clock pulse of the clock signal CLK is input a predetermined number of times from the timing of the change in polarity. The counter circuit 52 starts the count taking the polarity reversion detection signal LD as a trigger. In FIG. 5 and FIG. 6, the count value as parallel data obtained as the count signal cnt of the counter circuit 52 is represented by a decimal number, and there is shown a state in which the value of the count signal cnt is increasing after the time point t1.

Further, the external signal OS shown in FIG. 5 changes to the low level at the time point t2 after the time corresponding to 29 clock pulses of the clock signal CLK elapses from when the count is started at the time point t0. Therefore, in this case, the counter circuit 52 counts up to 29.

Further, since the count value of 29 is in the first range, the shift register circuit 53 outputs the sftreg signal in which a value of one bit becomes 1 which is a value representing the fact that the external signal OS is at the high level. The shift register circuit 53 outputs the sftreg signal in sync with the timing at which the polarity reversion detection signal LD becomes at the high level. Therefore, in the example shown in FIG. 5, the shift register circuit 53 outputs the sftreg signal xxxx_xxx1 in which the least significant bit is set to 1 at the time point t3.

In this stage, since the count as much as 8 bits is not performed, the latching signal generation circuit 54 does not output the out_EN signal. Therefore, in this stage, writing to the output register 51 is not performed.

In the example shown in FIG. 5, in the period after the external signal OS has changed to the low level at the time point t2 to the time point t4, namely the period corresponding to 124 clock pulses of the clock signal CLK, the state at the low level is kept. In this case, the counter circuit 52 counts up to 124. Since the count value of 124 is in the fourth range, the shift register circuit 53 outputs the sftreg signal in which the values of the low 4 bits are set to 0 which represents the low level while shifting the value 1 of the existing least significant bit toward higher bits. The shift register circuit 53 outputs the sftreg signal in sync with the timing at which the polarity reversion detection signal LD becomes at the high level. Therefore, in the example shown in FIG. 5, the shift register circuit 53 outputs the sftreg signal xxx1_0000 in which the fifth bit is set to 1 and the low 4 bits are set to 0 at the time point t5.

Also in this stage, since the count as much as 8 bits is not performed, the latching signal generation circuit 54 does not output the out_EN signal. Therefore, in this stage, writing to the output register 51 is not performed.

In the present example, in the period after the external signal OS has changed to the high level at the time point t4 to the time point t6 as shown in FIG. 6, namely the period corresponding to 93 clock pulses of the clock signal CLK, the state at the high level is kept. In this case, the counter circuit 52 counts up to 93. Since the count value of 93 is in the third range, the shift register circuit 53 outputs the sftreg signal in which the values of the low 3 bits are set to 1 which represents the high level while shifting the values 1_0000 corresponding to the existing 5 bits toward higher bits. The shift register circuit 53 outputs the sftreg signal in sync with the timing at which the polarity reversion detection signal LD becomes at the high level. Therefore, in the example shown in FIG. 6, the shift register circuit 53 outputs the sftreg signal 1000_0111 in which the high 5 bits are set to 1_0000 and the low 3 bits are set to 111 at the time point t7.

In this stage, since it results that the count as much as 8 bits has been performed, the latching signal generation circuit 54 outputs the out_EN signal at the time point t8. Therefore, in this stage, data having the same bit values as 1000_0111 as the sftreg signal is written to the output register 51. In the present embodiment, it is possible to write the data into the output register 51 in such a procedure, and it is possible for the user to designate whether to make the buffer circuits 22, 23 perform the output, and further, to designate the capacities of the buffer circuits 22, 23 by adjusting the values of the low 6 bits of the sftreg signal. Subsequently, the user inputs a predetermined signal to the predetermined terminal to thereby, for example, make the transition of the control circuit 50 to the normal mode, and make the buffer circuits 22, 23 output the oscillation signal having the capacity thus set.

(3) Other Embodiments

The embodiment described above is an example for implementing the present disclosure, and a variety of embodiments can be adopted besides the above. Further, the application object of the circuit device 2 according to an embodiment of the present disclosure is not limited, but the circuit device 2 according to the embodiment can be used for a variety of devices such as a variety of electronic apparatuses, electric components of a vehicle. Further, the circuit provided to the oscillator 1 is not limited to the circuit shown in FIG. 1 described above, it is possible to add a variety of circuits besides the above, or it is possible to omit a part of the circuit. For example, the oscillator 1 can be provided with a PLL circuit and so on, and the oscillation signal output from the oscillation circuit 10 can be input to the buffer circuits 21 through 23 after being processed by a variety of buffer circuits such as a waveform shaping buffer circuit. Further, the oscillation signals which can be output from the circuit device 2 are not limited to the three types. For example, the number of types of the oscillation signals to be output from the buffer circuits can be one, two, or four or more, and the capacity of at least one type of oscillation signal can be adjusted in the single-wire serial communication mode.

Further, the elements and the circuits constituting the embodiment described above are illustrative only, and the embodiment can be constituted by a variety of interchangeable elements and circuits. Further, the circuits such as the output register 51, the counter circuit 52, the shift register circuit 53, and the latching signal generation circuit 54 can be designed with a variety of methods. The elements and the coupling relationship of the circuits can be determined with a method such as describing the functions of the circuits with a hardware description language to automatically design the circuits via processing such as a simulation or a verification.

Further, the embodiment described above is an SPXO (Simple Packaged Crystal Oscillator), but can be an oscillator of another method such as a TCXO (Temperature Compensated Crystal Oscillator) or a VCXO (Voltage Controlled Crystal Oscillator).

Further, the functions of the terminals provided to the circuit device 2 are illustrative only, and can be different, or a terminal for a specific function can be assigned to a different terminal from the terminal shown in FIG. 1. Further, the functions in each of the modes are not limited to the functions described above. Further, in the single-wire serial communication mode, a variety of functions can be available in a variety of terminals besides the terminal for inputting the external signal OS. For example, it is possible to adopt a configuration capable of outputting temperature data or a configuration in which the oscillation signal is output from at least one of the buffer circuits 21 through 23 by inputting the enable signal to the terminal.

Further, the m-th range for determining whether to increase the digit of the bit value based on the counting result of the clock pulses of the clock signal CLK is not limited to the range defined as described above. Specifically, it is sufficient for the m-th range to be defined so that the count number included in the (m+1)-th range is a greater value than the count number included in the m-th range assuming m to be a natural number. Therefore, for example, the m-th range and the (m+1)-th range can be discretized as in the embodiment described above, but can also be made continuous. As the latter case, it is possible to set the ranges so that the upper limit value and the lower limit value of the ranges adjacent to each other are consecutive natural numbers such as when 1 through 34 are included in the first range, and 35 through 67 are included in the second range. Such ranges can similarly be set even as the n-th range used when counting the period of the second polarity.

Further, in the single-wire serial communication mode, it is possible to confirm whether or not the communication in the single-wire serial communication mode can be started. For example, it is possible for the circuit device 2 to have a configuration in which when the data corresponding to the external signal OS is predetermined data, the circuit device 2 performs an operation corresponding to the data corresponding to the external signal OS subsequently input. In this configuration, when the data corresponding to the external signal OS is not the predetermined data, the circuit device 2 does not perform the operation corresponding to the data corresponding to the external signal OS subsequently input.

In other words, the communication in the single-wire serial communication mode is not established unless the predetermined data is input as the external signal OS. According to this configuration, it is possible for the circuit device 2 to perform the operation corresponding to the data corresponding to the external signal OS after confirming the fact that the communication in the single-wire serial communication mode is appropriately performed using the predetermined data. Therefore, it is possible to prevent improper data from being stored in the output register 51 due to the improper external signal, and the operation corresponding to the improper data from being performed.

Such a configuration as described above can be realized by a configuration in which, for example, the control circuit 50 watches the data stored in the output register 51, and when the data stored is the predetermined data, the control circuit 50 stores the data corresponding to the subsequent external signal in the output register 51. In this case, when the data stored in the output register 51 is not the predetermined data, the data corresponding to the subsequent external signal is not stored in the output register 51.

It is obvious that this configuration is illustrative only, and the data corresponding to the subsequent external signal is stored in the output register 51 irrespective of whether or not the data stored in the output register 51 is the predetermined data, but it is possible to adopt a configuration in which the processing corresponding to the data which corresponds to the subsequent external signal and is stored in the output register 51 is not started unless the data stored is the predetermined data. It should be noted that the processing of confirming whether or not the communication is proper using the predetermined data can be executed in arbitrary terms. For example the confirmation with the predetermined data can be performed every time the communication as much as 8 bits is performed, or it is possible to adopt a configuration in which the confirmation with the predetermined data is not performed until the communication as much as a predetermined number of bits is performed after the confirmation with the predetermined data has been performed.

What is claimed is:

1. An oscillator comprising:
a resonator; and
a circuit device, wherein
the circuit device includes
  a first terminal,
  a storage circuit configured to store data corresponding to an external signal input from the first terminal,
  an oscillation circuit configured to generate an oscillation signal using the resonator,
  a counter circuit configured to count a period in which the external signal has a first polarity and a period in which the external signal has a second polarity using a clock signal generated based on the oscillation signal, and
  a processing circuit configured to write the data in the storage circuit based on a counting result of the counter circuit, wherein
the processing circuit writes a first value in m bits in a row in the storage circuit when the counting result of the period in which the external signal has the first polarity is an m-th range
where m is a natural number, and a count number included in an (m+1)-th range is greater than a count number included in the m-th range.

2. The oscillator according to claim 1, wherein
defining k as a unit count number as a natural number, and Δk as a unit tolerance number as a natural number,
the m-th range is a range in which the counting result takes a value in a range of m×(k−Δk) through m×(k+Δk).

3. The oscillator according to claim 1, wherein
when the data corresponding to the external signal is predetermined data, the circuit device performs an operation corresponding to the data corresponding to the external signal subsequently input, and
when the data corresponding to the external signal fails to be the predetermined data, the circuit device fails to perform the operation corresponding to the data corresponding to the external signal subsequently input.

4. The oscillator according to claim 1, wherein
the circuit device further includes a buffer circuit configured to buffer and then output the oscillation signal, and
the data stored in the storage circuit includes data for adjusting a capacity of the buffer circuit.

5. The oscillator according to claim 1, wherein
the data to be stored in the storage circuit includes data for instructing whether to output the oscillation signal.

6. The oscillator according to claim 1, further comprising:
a container configured to house the resonator and the circuit device, wherein
the container has a first external terminal electrically coupled to the first terminal.

7. The oscillator according to claim 1, wherein
the oscillation circuit supplies an external device with the oscillation signal, and
the external signal is a signal generated by the external device using a clock signal generated based on the oscillation signal.

8. An oscillator comprising,
a resonator; and
a circuit device, wherein
the circuit device includes
  a first terminal,
  a storage circuit configured to store data corresponding to an external signal input from the first terminal,
  an oscillation circuit configured to generate an oscillation signal using the resonator,
  a counter circuit configured to count a period in which the external signal has a first polarity and a period in which the external signal has a second polarity using a clock signal generated based on the oscillation signal, and
  a processing circuit configured to write the data in the storage circuit based on a counting result of the counter circuit, wherein
the processing circuit writes a second value in n bits in a row in the storage circuit when the counting result of the period in which the external signal has the second polarity is in an n-th range
where n is a natural number, and a count number included in an (n+1)-th range is greater than a count number included in the n-th range.

9. The oscillator according to claim 8, wherein
defining k as a unit count number as a natural number, and Δk as a unit tolerance number as a natural number,
the n-th range is a range in which the counting result takes a value in a range of n×(k−Δk) through n×(k+Δk).

10. A communication method using an oscillator including a resonator and a circuit device, the method comprising:
inputting by an external device an external signal to a first terminal of the circuit device;
generating by the oscillator a clock signal using the resonator;
counting a period in which the external signal has a first polarity and a period in which the external signal has a second polarity using the clock signal; and
writing data corresponding to the external signal in a storage circuit based on a result of the counting, wherein
in the writing, a first value is written in m bits in a row in the storage circuit when the counting result of the period in which the external signal has the first polarity is in an m-th range, and
where m is a natural number and a count number included in an (m+1)-th range is greater than a count number included in the m-th range.

* * * * *